United States Patent [19]
Strong

[11] Patent Number: 5,989,780
[45] Date of Patent: Nov. 23, 1999

[54] METHOD AND APPARATUS FOR PRODUCING CONSISTENT THICKNESS CAP RESIN LAYERS DURING PRINTING PLATE PRODUCTION

[75] Inventor: Kenneth M. Strong, Hockessin, Del.

[73] Assignee: MacDermid Imaging Technology Incorporated, Waterbury, Conn.

[21] Appl. No.: 08/829,322

[22] Filed: Mar. 27, 1997

[51] Int. Cl.⁶ ................................. G03F 7/16; G03F 7/26
[52] U.S. Cl. ...................... 430/300; 430/269; 430/271.1; 430/306
[58] Field of Search ................................ 430/269, 271.1, 430/300, 306

[56] References Cited

U.S. PATENT DOCUMENTS

| | | | |
|---|---|---|---|
| 4,056,423 | 11/1977 | Hughes | 156/356 |
| 4,383,759 | 5/1983 | Bloothoofd et al. | 355/85 |
| 4,638,758 | 1/1987 | Bloothoofd | 430/935 X |
| 5,348,605 | 9/1994 | Hughes et al. | 430/300 X |

Primary Examiner—Cynthia Hamilton
Attorney, Agent, or Firm—William A. Simons; Wiggin & Dana

[57] ABSTRACT

Printing plates are formed from a layer of photo polymerizable resin by a process and assembly which includes a negative of the image or images to be formed in the printing plate. The negative is placed on a lower glass support plate and a bank of lights is disposed below the lower glass support plate. A cover film is laid down on the negative, and a very thin layer of resin, called a cap resin, is deposited on the cover film. A layer of the resin to be cross-linked is deposited on the cap resin layer, and the cross-linked resin layer is covered with a polyester sheet, on the top of which an upper glass plate is lowered. The cap resin layer and the cross-linked resin layer are both laid down on the lower glass plate assembly by meas of a carriage assembly that traverses over the lower glass plate assembly, and which carries the cross-linking resin and cap resin reservoir. The thickness of the cross-linked resin layer varies widely, while the thickness of the cap resin layer is narrowly confined. The carriage assembly is provided with a cap resin doctor blade that is maintained a constant distance above the lower glass plate, irregardless of the spacing between the cross-linked resin layer reservoir on the carriage assembly and the lower glass plate. In this manner, a constant thickness cap resin layer can be deposited on the lower glass plate in conjunction with different thickness cross-linking resin layers.

10 Claims, 3 Drawing Sheets

METHOD AND APPARATUS FOR
PRODUCING CONSISTENT THICKNESS
CAP RESIN LAYERS DURING PRINTING
PLATE PRODUCTION

BACKGROUND OF THE INVENTION

1. Field of the Invention

The present invention relates to the production of printing plates from photopolymerizable resins. More particularly, this invention relates to the production of printing plates wherein a cap resin layer with a consistent thickness is automatically laid on a glass plate-negative assembly irrespective of the thickness of the photopolymerizable resin layer on the assembly.

2. Brief Description of the Art

The production of printing plates by selectively cross-linking polymerizable resins is known in the prior art. The printing plate is conventionally formed by first placing a negative on a supporting glass plate. An optically transparent capping resin layer is then deposited on top of the negative and the capping resin layer is subsequently coated with a layer of photopolymerizable resin. A backing sheet is then placed on top of the photopolymerizable resin, and the backing sheet is then covered by another glass sheet. Irradiation by actinic light, such as UV light, through the top glass/backing sheet combination forms a solid floor layer of photoresin, which adheres to the backing sheet. The thickness of the floor layer is less than the total thickness of the photoresin. Irradiation through the lower glass plate/negative/capping resin layer selectively hardens the photoresin to form an image-printing surface which mirrors the image on the negative. The hardened regions adhere to the floor layer, but not to the transparent release sheet. Subsequent processing removes unhardened (liquid) photoresin to reveal a relief image. The photopolymerizable resin layer which is placed on the release film will have various thicknesses depending on the thickness of the printing plate to be produced, while the capping resin layer has a relatively constant thickness which is a fraction of the thickness of the cross-linkable resin layer. Both of the resin layers are deposited on the glass plate assembly from a carriage which carries bulk supplies of each of the cap and cross-linkable resins, and which is selectively passed over the glass plate-negative assembly so as to facilitate deposition of the resin layers on the negative. The thickness of the capping resin layer is controlled by a doctor blade which is mounted on the carriage and is drawn across the capping resin layer so as to level and control the thickness of the capping resin layer on the negative. The thickness of the cross-linkable resin layer is determined by the distance of the carriage from the glass plate assembly. Thus, when a relatively thin layer of the cross-linkable resin is to be deposited on the glass plate assembly, the carriage will be lowered toward the glass plate assembly, and when a relatively thick layer of the cross-linkable resin is to be deposited on the glass plate assembly, the carriage will be lifted away from the glass plate assembly.

The resultant assembly will have a relatively thin and constant thickness cap resin layer formed on the supporting glass plate assembly; and can have either relatively thick or relatively thin cross-linkable resin layers on them. The prior art procedure is satisfactory when the printing plates being produced have the same thickness from production run-to-run, and thus the same thickness cross-linkable resin layer; however, when different thickness printing plates are produced from run-to-run, a manual adjustment of the position of the cap resin doctor blade must be made relative to the glass support plate so as to provide the proper cap resin layer thickness. Presently, when the thickness of the resin printing plate is changed, the cap resin layer must be manually poured onto the glass support plate assembly; and the position of the capping blade must then be manually adjusted relative to the glass support plate assembly; and the capping blade must then be manually dragged across the resin puddle, and readjusted if necessary, until one can confirm that the resultant cap resin layer thickness will be as required. The aforesaid procedure is both time-consuming and wasteful of resin.

It would be desirable to be able to automatically produce the constant desired thickness of the cap resin layer irregardless of the thickness of the printing plates being produced.

BRIEF SUMMARY OF THE INVENTION

This invention relates to a method and apparatus for use in automatically producing a printing pate assembly wherein the cap resin layers will have a constant thickness when cross-linkable resin layers having differing thicknesses are deposited on the glass plate assembly.

Printing plates which are produced in accordance with this invention are formed in a fixture which includes a lower assembly having a lower UV light bank; and a glass resin-support plate that is disposed above the lower light bank. The printing surface-defining negative is positioned on the glass support plate, and a protective cover film is laid on the negative. The cap resin layer is deposited on the protective film and the cross-linkable resin layer is deposited on the cap resin layer. The resin layers are both deposited on the glass plate assembly from a common carriage assembly which carries a cap resin reservoir and also carries a cross-linkable resin reservoir. The carriage assembly includes a cap resin layer doctor blade that is mounted on a support bar which can float vertically, within limits, relative to the remainder of the carriage assembly. The cap resin reservoir is preferably mounted on the doctor blade, and the cap resin doctor blade is operable to evenly distribute a layer of resin curtained onto the glass support plate assembly from the cap resin reservoir. The support bar is mounted on guide rollers that contact the glass support plate assembly and determine the elevation of the cap resin doctor blade relative to the glass plate assembly. When the carriage is raised or lowered to accommodate different cross-linkable resin layer thicknesses, the support bar and the doctor blade will stay in the same vertical position relative to the glass support plate due to the fact that the vertical position of the support bar is dictated by the support bar guide rollers which contact the glass plate assembly, which support bar guide rollers that are connected to the remainder of the carriage by means of a sliding joint.

The remainder of the carriage assembly which carries the cross-linkable resin reservoir is mounted on separate rollers which contact the glass support plate assembly directly, or shim tracks disposed on the glass support plate assembly. The thickness of the cross-linkable resin layer will typically vary from about 0.045 in. to about 0.285 in., and the thickness of the shim tracks is used to control the vertical position of the remainder of the carriage relative to the glass support plate assembly. Thus, thicker shim tracks are used to produce thicker printing plates. The portion of the carriage which carries the cross-linkable resin reservoir also includes a separate doctor blade that smooths the cross-linkable resin layer which is deposited on the cap resin layer on the glass plate assembly. Thus, the vertical positioning of the cap resin-depositing portion of the carriage assembly (relative to the glass support plate assembly) can be automatically fixed, while the vertical positioning of the cross-linkable resin-depositing portion of the carriage assembly (relative to the glass support plate assembly) can be automatically varied. Thus, the carriage can move up and down while the support bar assembly stays in the same place.

The cap and cross-linkable resin dispensing systems also benefit from a controllable degree of dispensing accuracy without the need of an expensive piston pump. One aspect of the preferred system of this invention includes resin tanks that are pre-pressurized combined with biased check valves that will selectively dispense the respective resins from the tanks. One embodiment of the dispensing system of this invention can include timers for triggering air solenoids so as to selectively pressurize and vent the resin tanks. The resins can be fed into separate manifolds from the tanks through valved tubes which connect the tanks with the manifolds. Preferably, the resins will flow onto the glass support plate assembly through a narrow slot at the top of the manifolds, and the resin flow will stop when the tanks are vented to release pressure in the tanks. Thus, the pressure in the tanks provides the forces necessary to expel the resins from the manifolds onto the glass support plate assembly. The cap resin reservoir and its manifold are conveniently mounted on the cap resin doctor blade.

It is therefore an object of this invention to provide a method and apparatus for producing cross-linked polymer printing plates.

It is a further object of this invention to provide a method and apparatus of the character described which automatically adjusts for the use of constant thickness cap resin layers with different thickness cross-linkable resin layers during production of the printing plates. These and other objects and advantages of the invention will become more readily apparent from the following detailed description of an embodiment thereof when taken in conjunction with the accompanying drawings in which:

DETAILED DESCRIPTION OF THE PREFERRED EMBODIMENTS

Figure 1:
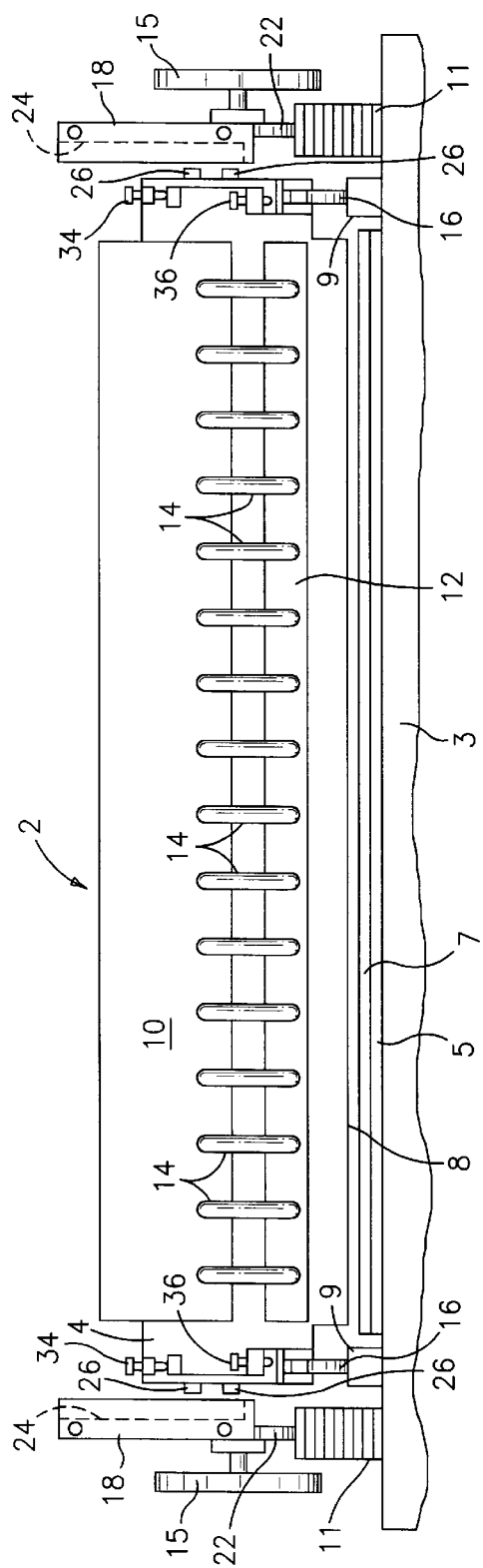
FIG. 1 is a front elevational view of a cap resin dispensing and doctor blade assembly formed in accordance with this invention.
Figure 2:
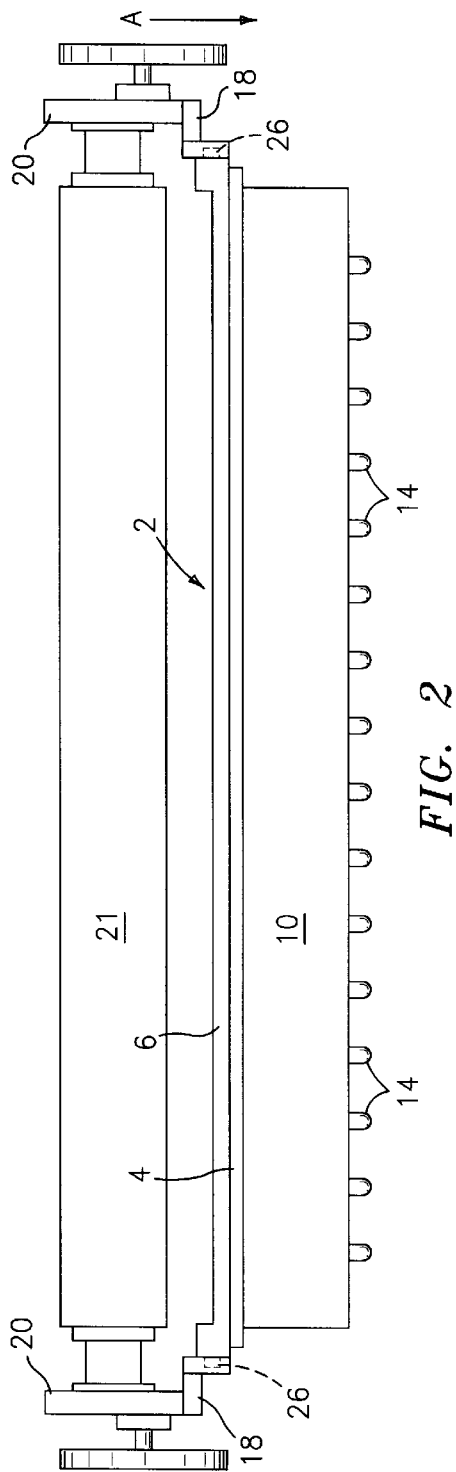
FIG. 2 is a top plan view of the assembly of FIG. 1.

Referring now to the drawings, there is shown in FIGS. 1 and 2 a cap resin doctor blade and support bar assembly which is denoted generally by the numeral 2. The doctor blade 4 is adjustably mounted on the support bar 6, and includes a lower edge 8 which scrapes over the cap resin layer that is deposited on the printing plate work surface. In FIG. 1, the lower glass plate is denoted by the numeral 3. The negative 5 is disposed on the lower glass plate 3, and the protective film 7 is disposed on the negative 5. A cap resin reservoir 10 is mounted on the doctor blade 4, and a cap resin manifold 12 is also mounted on the doctor blade 4 below the reservoir 10 and proximal to the lower edge 8 of the doctor blade 4. A plurality of resin transfer lines 14 extend between the reservoir 10 and the manifold 12. In order to deposit cap resin on the protective film layer 7, the manifold 12 is provided with a transverse slit in its upper surface. During the movement of the assembly 2 over the printing plate work surface, the reservoir 10 will be pressurized causing resin to flow through the transfer lines 14 into the manifold 12, and also causing the resin to flow out of the manifold 12 through the slit and onto the protective film 7. When a resin deposition pass is finished, the reservoir 10 will be depressurized, and the resin will stop flowing out of the assembly 2. The doctor blade and support bar assembly 2 is provided with guide and positioning rollers 16 which contact shims 9 which are disposed on edges of the protective film 7. The thickness of the shims 9 control the distance between the lower edge 8 of the doctor blade 4 and the protective film 7. The rollers 16 and shims 9 thus combine to control the thickness of the cap resin layer.

Translatory movement of the assembly 2 over the work surface in the direction of the arrow A is caused by a pair of side bars 18 which are connected to carriage arms 20. A set of outermost rollers 15 is mounted on the carriage arms 20, and serve a purpose which will be clarified hereinafter. The carriage arms 20 and side bars 18 are mounted on rollers 22 which travel over shims 11 which are mounted on the lower glass plate 3. The shims 11 control the vertical position of the carriage arms 20 and side bars 18 relative to the work surface, and thus control the distance between the printing plate resin reservoir 21 and the work surface upon which the printing plate resin is deposited. The side bars 18 are provided with vertical slots 24 which receive roller bearings 26 mounted on the support bar 6. The vertical slots 24 and roller bearings 26 provide a translational driving connection between the carriage arms 20 and the assembly 2 while, at the same time, allowing the carriage arms 20 and the assembly 2 to be selectively positioned at different heights above the work surface simply by changing the shims 11, e.g., the use of thinner shims 11 will result in a thinner printing plate resin layer, and the use of thicker shims 11 will result in a thicker printing plate resin layer. The shim set 11 can consist of a plurality of like shims stacked on top of each other. In this manner, a constant thickness cap resin layer can be deposited on the work surface by using the same thickness shims 9, which different thickness layers of the cross-linkable resin are deposited on the cap resin layer by varying the thickness of the shims 11.

Figure 3:
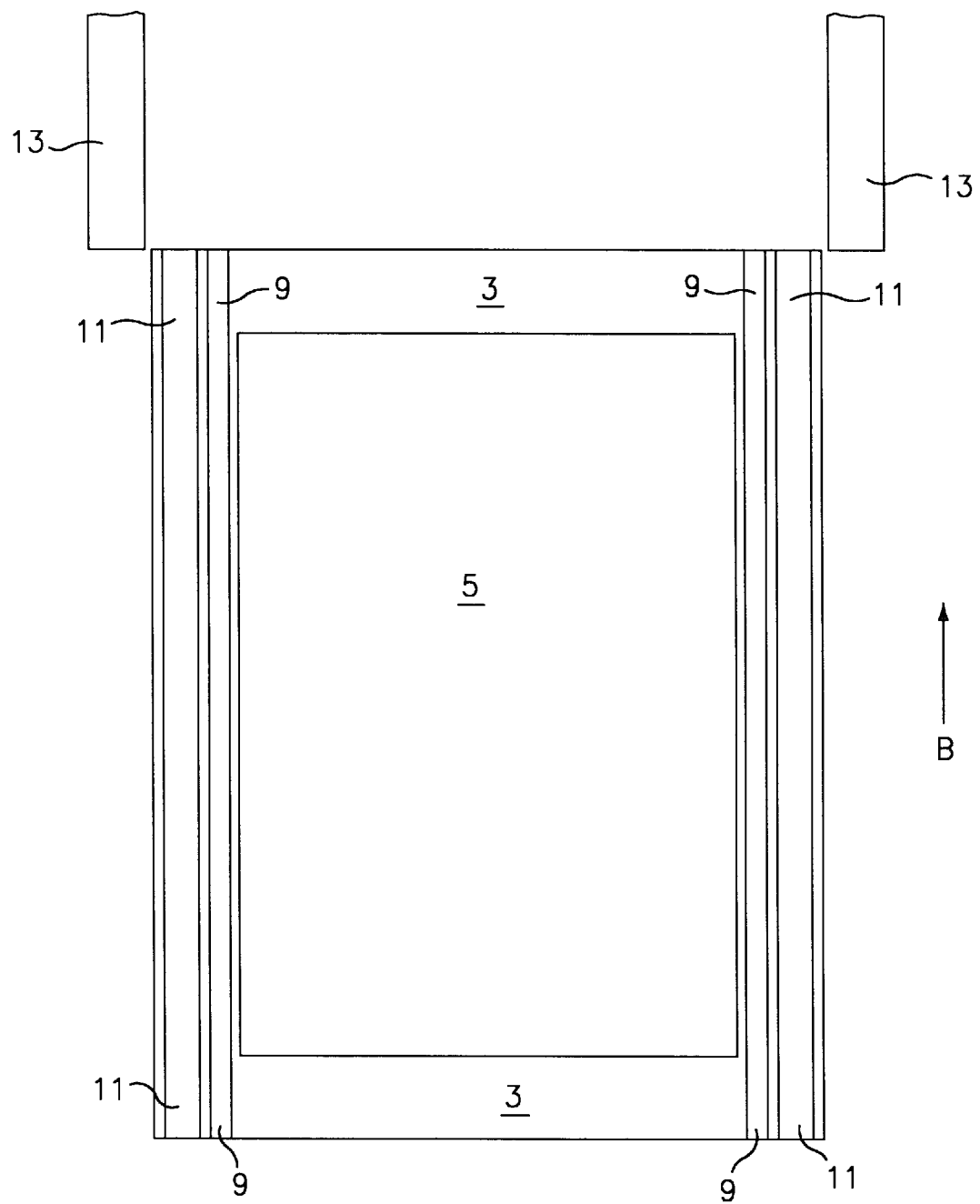
FIG. 3 is a top plan view of the work surface area of the assembly.

FIG. 3 is a plan view of the resin-depositing area of the assembly. FIG. 3 shows how the various components are arranged on the lower glass plate 3. The image negative 5 is positioned essentially in the middle of the lower glass plate 3, and the shim sets 9 and 11 flank the negative 5 on the glass plate 3. Ramps 13 are positioned just beyond one edge of glass plate 3 and are aligned with the rollers 15 that are mounted on the outer sides of the carriage arms 20. The ramps 13 are operable to engage the rollers 15 to lift the entire assembly 2 upward away from the glass plate 3 after a resin depositing pass has been made over the glass plate 3 and negative 5 (in the direction of the arrow B). Thus, when a resin-depositing pass is finished, the resin-depositing assembly 2 is automatically lifted up and away from the glass plate 3, so that the resultant resin printing plate can be removed from the glass plate 3 after the resin has been properly cross-linked.

Figure 4:
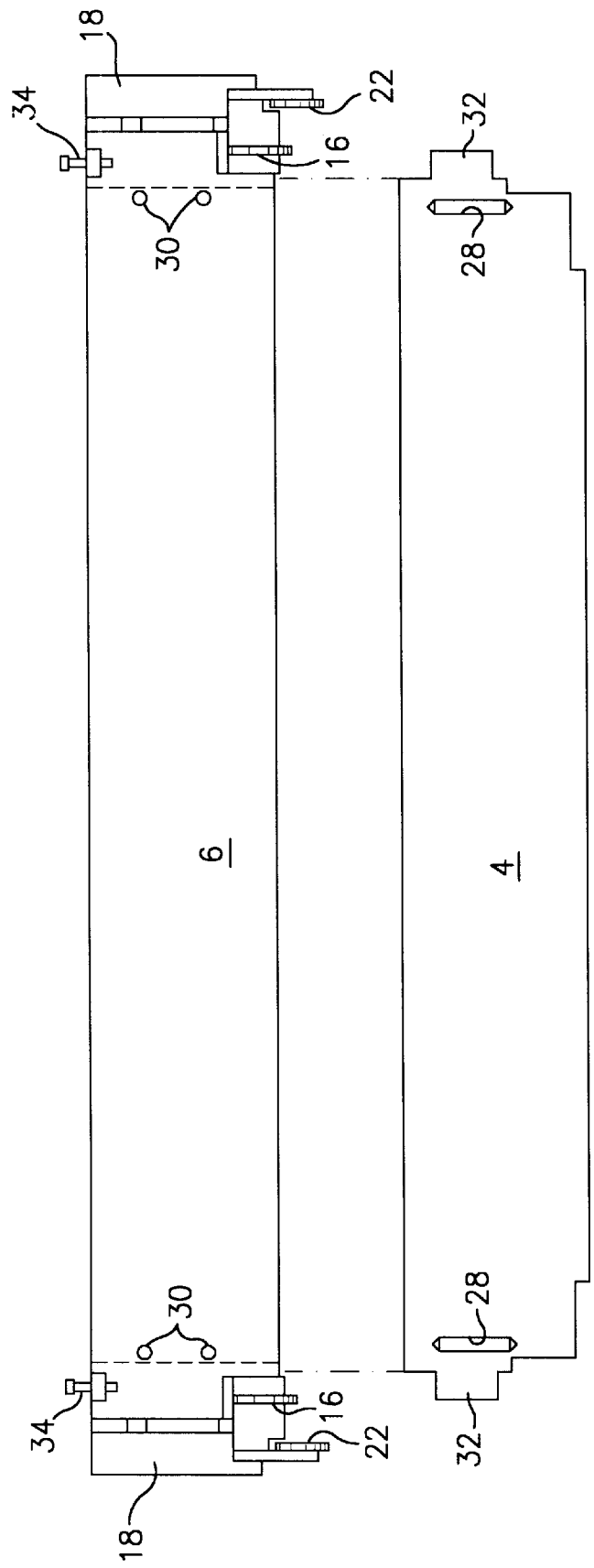
FIG. 4 is an exploded from elevational view of the cap resin dispensing and doctor blade support bar assembly.

FIG. 4 is illustrative of the manner in which the doctor blade 4 is mounted on the support bar 6. The doctor blade 4 is provided with a pair of elongated slots 28 and the support bar 6 is provided with sets of spaced-apart threaded holes 30. The doctor blade 4 is affixed to the support bar 6 by means of support bolts which pass through the slots 28 and are threaded into the holes 30. Loosening the support bolts allows one to move the doctor blade 4 up or down relative to the support bar 6. Thus, the doctor blade 4 can be moved up or down relative to the support bar 6; and the carriage arms 20 and the carriage side bars 18 can be moved up or down relative to the support bar 6. The doctor blade 4 is also provided with a pair of lateral ears 32 which are engaged by adjustable stop bolts 34 and 36 on the support bar 6. The stop bolts 34 and 36 are used to precisely locate the doctor blade 4 relative to the support bar 6, and the support bolts are then tightened so as to lock the doctor blade 4 to the support bar 6.

It will be readily appreciated that the cap resin depositing assembly of this invention will automatically provide the proper cap resin thickness irregardless of the plate resin thickness. The assembly of this invention enables one to quickly and accurately produce cross-linked resin printing plates of high quality and with enhanced resin conservation. Operation of the assembly is automatic, and there is no need to perform manual leveling of the resin layers that are cast onto the negative.

Since many changes and variations of the disclosed embodiment of the invention may be made without departing from the inventive concept, it is not intended to limit the invention otherwise than as required by the appended claims.

What is claimed is:

1. A method for forming cross-linkable photopolymerizable resin printing plate precursors, said method comprising the steps of:

a) providing a resin-depositing assembly including a cap resin source and a printing plate resin source;

b) providing a lower transparent plate assembly which includes a first lower transparent plate;

c) depositing a cap resin layer on the first lower transparent plate from said cap resin source, the cap resin layer having a first cap resin layer thickness;

d) depositing a printing plate resin layer on said cap resin layer from said printing plate resin source, said printing plate resin layer having a first printing plate resin layer thickness; and e) adjusting the resin-depositing assembly so that when steps b-d are repeated utilizing a second lower transparent plate instead of the first lower transparent plate, the second lower transparent plate receives a cap resin layer having a thickness identical to the first cap resin layer thickness while receiving a printing plate resin layer having a second thickness substantially different from the first printing plate resin layer thickness;

wherein the adjusting step comprises adjusting the resin-depositing assembly to provide said second thickness in the absence of adjusting the resin-depositing assembly to maintain said first cap resin layer thickness.

2. The method of claim 1, wherein the step of adjusting comprises altering a shim height.

3. The method of claim 2, wherein said altering is achieved by at least one of adding and removing first and second shims on opposite sides of the lower transparent plate assembly.

4. The method of claim 1, wherein the step of depositing the cap resin layer comprises flowing said cap resin under pressure from a cap resin reservoir through a plurality of transfer lines to a cap resin manifold.

5. The method of claim 4, wherein the step of depositing the cap resin layer comprises directing the flow of cap resin upward through a slit in the manifold.

6. A method for forming cross-linked photopolymerized resin printing plates comprising forming cross-linkable photopolymerizable resin printing plate precursors according to claim 1, and selectively exposing areas of the precursors to light effective to cross-link and photopolymerize said areas.

7. A method for forming a plurality of printing plates, each of which have a cross-linked photopolymerized cap layer of a single thickness and a cross-linked photopolymerized resin printing plate layer, of differing thicknesses said method comprising:

(a) providing a resin-depositing assembly including a cap resin source having a settable cap resin thickness and a printing plate resin source having a settable printing plate resin thickness;

(b) providing a lower plate assembly which includes a lower plate;

(c) depositing a cap resin layer on the lower plate from the cap resin source;

(d) depositing a printing plate resin layer on said cap resin layer;

(e) selectively exposing areas of the precursor to light effective to cross-link and photopolymerize said areas;

(f) removing said lower transparent plate;

(g) adjusting the resin-depositing assembly so as to change said settable printing plate resin thickness from said first thickness to said second thickness while allowing the cap resin source to float vertically relative to the printing plate resin source so that the settable cap resin thickness remains at said first cap resin thickness so as to omit an independent readjustment of said settable cap resin thickness to maintain said first cap resin thickness;

(h) repeating steps (b)–(f) to produce a second cross-linked photopolymerized resin printing plate.

8. The method of claim 7, wherein said adjusting step comprises varying the height of a pair of shim stacks which support the printing plate resin source as the printing plate resin layer is deposited.

9. The method of claim 7, wherein the step of depositing the cap resin layer comprises flowing said cap resin layer under pressure from a cap resin reservoir through a plurality of transfer lines to a cap resin manifold and, therefrom, to the lower plate.

10. The method of claim 6, wherein the step of adjusting comprises adding first and second shims on opposite sides of the lower glass plate, which shims are effective to raise the printing plate resin source without raising the cap resin source.

\* \* \* \* \*